(12) United States Patent
Kumar et al.

(10) Patent No.: US 9,007,855 B2
(45) Date of Patent: Apr. 14, 2015

(54) DATA SIGNAL RECEIVER AND METHOD OF CALIBRATING A DATA SIGNAL RECEIVER

(71) Applicant: ARM Limited, Cambridge (GB)

(72) Inventors: Nidhir Kumar, Bangalore (IN); Gyan Prakash, Bangalore (IN); Muniswara Reddy Vorugu, Bangalore (IN)

(73) Assignee: ARM Limited, Cambridge (GB)

( * ) Notice: Subject to any disclaimer, the term of this patent is extended or adjusted under 35 U.S.C. 154(b) by 126 days.

(21) Appl. No.: 13/726,395

(22) Filed: Dec. 24, 2012

(65) Prior Publication Data

US 2014/0177377 A1 Jun. 26, 2014

(51) Int. Cl.
*G11C 7/00* (2006.01)
*G11C 8/18* (2006.01)

(52) U.S. Cl.
CPC ......................................... *G11C 8/18* (2013.01)

(58) Field of Classification Search
USPC ..................................... 365/193, 194, 233.12
See application file for complete search history.

(56) References Cited

U.S. PATENT DOCUMENTS

| 7,036,053 | B2 | 4/2006 | Zumkehr et al. |
| 7,111,111 | B2 | 9/2006 | Neuman et al. |
| 7,165,185 | B2 | 1/2007 | Li et al. |
| 7,499,368 | B2 | 3/2009 | Rao et al. |
| 7,886,174 | B2 | 2/2011 | Spry et al. |
| 8,037,375 | B2 | 10/2011 | Schaefer |
| 8,121,237 | B2 * | 2/2012 | Stott et al. ..................... 375/355 |
| 8,295,118 | B2 | 10/2012 | Best et al. |
| 2007/0002642 | A1 | 1/2007 | Butt et al. |
| 2008/0276133 | A1 | 11/2008 | Hadley et al. |
| 2010/0246290 | A1 | 9/2010 | MacLaren et al. |
| 2011/0040902 | A1 | 2/2011 | Housty |
| 2011/0078370 | A1 | 3/2011 | Chaudhuri et al. |
| 2011/0128793 | A1 | 6/2011 | Venkataraman et al. |
| 2011/0158020 | A1 | 6/2011 | Hwang |

OTHER PUBLICATIONS

Notice of Allowance mailed Mar. 11, 2014 in co-pending U.S. Appl. No. 13/726,392.
U.S. Appl. No. 13/726,392, filed Dec. 24, 2012, Kumar et al.
U.S. Appl. No. 13/726,383, filed Dec. 24, 2012, Prakash et al.
U.S. Appl. No. 13/854,226, filed Apr. 1, 2013, Prakash et al.
U.S. Appl. No. 13/861,641, filed Apr. 12, 2013, Prakash et al.

(Continued)

*Primary Examiner* — Son Dinh
*Assistant Examiner* — Nam Nguyen
(74) *Attorney, Agent, or Firm* — Nixon & Vanderhye P.C.

(57) ABSTRACT

A method of calibrating a data signal receiver configured to receive a multi-bit data signal and an associated data strobe signal, wherein transitions of the data strobe signal indicate sample points for the multi-bit data signal. The method comprises the steps of: receiving, on each bit of the multi-bit data signal, a sample of a predetermined data pattern; determining, for each bit of the multi-bit data signal, a relative start timing value indicative of a start of the predetermined data pattern; determining, for each bit of the multi-bit data signal, a relative end timing value indicative of an end of the predetermined data pattern; determining, for each bit of the multi-bit data signal, a mid-point timing value halfway between the relative start timing value and the relative end timing value; applying a bit timing delay to each bit of the multi-bit data signal such that the mid-point timing values are aligned; and applying a strobe timing delay to the associated data strobe signal to align the associated data strobe signal with the aligned mid-point timing values.

20 Claims, 16 Drawing Sheets

(56) References Cited

OTHER PUBLICATIONS

"JESD79-3F (Revision of JESD79-3E, Jul. 2010)", DDR3 SDRAM Standard, (Jul. 2012), 226 pages.

P. Fleming et al, "Algorithm for Adjustment of DDR Write Interface Timing" ISSC 2008, Jun. 2008, pp. 144-148.

Office Action mailed Sep. 16, 2014 in co-pending U.S. Appl. No. 13/854,226, 7 pages.

* cited by examiner

DATA SIGNAL RECEIVER AND METHOD OF CALIBRATING A DATA SIGNAL RECEIVER

BACKGROUND OF THE INVENTION

This application incorporates by reference the subject matter disclosed in each of the concurrently filed applications entitled "An Interface For Controlling The Phase Alignment Of Clock Signals For A Recipient Device" by Gyan Prakash et al and "A Method and Apparatus for Aligning a Clock Signal and a Data Strobe Signal in a Memory System" by Nidhar Kumar et al."

FIELD OF THE INVENTION

The present invention relates to a data signal receiver. More particularly, this invention relates to the calibration of a data signal receiver to receive a multi-bit data signal and an associated data strobe signal.

DESCRIPTION OF THE PRIOR ART

It is known to provide a data signal receiver configured to receive a multi-bit data signal and an associated data strobe signal, wherein transitions of the data strobe signal indicate sample points for the multi-bit data signal. A typical contemporary example of such a receiver is as part of a dual data rate (DDR) dynamic random-access memory (DRAM) system, in which read data (DQ) transmitted from the DRAM modules to the memory controller is captured on both the rising and the falling edge of the data strobe signal (DQS). In order for the data signal receiver in the memory controller to reliably interpret the DQ signal, it is necessary for the data strobe signal DQS to be correctly aligned with the data signal DQ.

According to the state of the art, the corresponding JEDEC standard (JESD79-3E) defines a read data eye training procedure which seeks to centre the DQS transitions in the middle of the DQ "data eyes" in order to balance the set-up and hold times for each read data eye. This standard assumes that the individual data bits of the DQ data are aligned with one another. However, as differential data rates increase, for example at the DDR data rates above 1600 Mb/s in a DDR3 system, the read data eye training process becomes particularly difficult, because of the presence of system jitter, PCB trace skew and DRAM uncertainty which render known automated self-calibration systems unreliable. In high frequency regimes (for example operating at data rates of 2133 Mb/s, where the ideal data eye has an opening of only 468 ps), typical system jitter, PCB trace skew and DRAM uncertainty are such that the above-mentioned technique of simply seeking to set the DQS in the centre of the DQ bus is not reliable.

It would be desirable to provide an improved technique for calibrating a data signal receiver for operation at high data rates to achieve an improved read eye opening in the presence of typical system jitter, PCB trace skew and DRAM uncertainty.

SUMMARY OF THE INVENTION

Viewed from a first aspect, the present invention provides a method of calibrating a data signal receiver, said data signal receiver configured to receive a multi-bit data signal and an associated data strobe signal, wherein transitions of said data strobe signal indicate sample points for said multi-bit data signal, the method comprising the steps of:

receiving, on each bit of said multi-bit data signal, a sample of a predetermined data pattern;

determining, for each bit of said multi-bit data signal, a relative start timing value indicative of a start of said predetermined data pattern;

determining, for each bit of said multi-bit data signal, a relative end timing value indicative of an end of said predetermined data pattern;

determining, for each bit of said multi-bit data signal, a mid-point timing value halfway between said relative start timing value and said relative end timing value;

applying a bit timing delay to each bit of said multi-bit data signal such that the mid-point timing values are aligned; and applying a strobe timing delay to said associated data strobe signal to align said associated data strobe signal with the aligned mid-point timing values.

The inventors of the present invention have realised that the assumption that the multiple bits of the DQ signal are aligned with one another (such as is the case in the JEDEC defined approach) can no longer be relied upon under the conditions which are encountered at the high data rates to which contemporary differential data signal systems are progressing. In order to address this, the present invention provides a calibration technique for a data signal receiver in which a predetermined data pattern (for example an alternating sequence of ones and zeros) is transmitted as the multi-bit data signal and sampled by the data signal receiver. Both the start and the end of the predetermined data pattern for each bit of the multi-bit data signal are then determined, allowing a determination of a mid-point timing value (half-way between the start and the end) to be determined for each bit of the multi-bit data signal. A timing delay is then added to each bit of the multi-bit data signal such that these mid-point timing values are aligned across all bits of the multi-bit data signal and the timing of the associated data strobe signal (by means of a strobe timing delay) is then adjusted to align the data strobe signal with these aligned mid-point timing values. This particular method for alignment between the read eyes of the multi-bit data signal and the data strobe signal is referred to herein as the "optimum eye" mode.

Accordingly, by this technique the centres of the read eyes for each bit of the multi-bit data signal are aligned with one another, advantageously providing an overall improvement in the setup and hold time margins for each bit of the read eyes over prior art approach in which the read eye starts for each bit are arranged to align with one another.

Whilst the relative start timing values could be determined in a number of ways, in one embodiment determining said relative start timing value comprises:

comparing said sample of said predetermined data pattern received in said receiving step with a predetermined data pattern portion when said associated data strobe signal has a timing offset;

if said sample of said predetermined data pattern received in said receiving step does not match said predetermined data pattern portion, incrementing said timing offset and repeating said receiving step; and determining said relative start timing value with reference to said timing offset when said sample of said predetermined data pattern received in said receiving step matches said predetermined data pattern portion.

The determination of the relative start timing value (performed for each bit of the multi-bit data signal) can thus be performed by using a timing offset applied to the associated data strobe signal. An iterative process is performed in which this timing offset is incremented and the sample of the predetermined data pattern captured by the signal receiver is compared to a predetermined data pattern portion. Accordingly, it will be understood that the predetermined data pattern portion need not be equivalent to the entirety of the predetermined data pattern transmitted to the data signal receiver, but may be only a subset thereof. The start of the predetermined data pattern is identified by incrementing the timing offset until a match between the received sample of the predetermined data pattern matches the predetermined data pattern portion.

Hence to take one example, where the predetermined data pattern transmitted is an alternating sequence of ones and zeros (e.g. an 8-bit burst of 0101010101), the data signal receiver may capture 4 bits as the sample and compare this against a pre-stored value of 0101 (the predetermined data pattern portion).

In other words, the relative timing of the sample of the predetermined data pattern received and the predetermined data pattern portion against which it is compared is adjusted in an incremental fashion until the two match, thus giving a value of the timing offset for the associated data strobe signal corresponding to the start of the predetermined data pattern transmitted. Note that a relative start timing value is determined for each bit of the multi-bit data signal, but that the incrementing of the timing offset can be performed relative to all bits of the multi-bit data signal, such that in a single sweep of the timing offset value the relative start timing value for each bit may be determined.

In some embodiments, said incrementing said timing offset and repeating said receiving step comprises:

a first stage in which said timing offset is incremented at each iteration by a coarse increment until said predetermined data pattern received in said receiving step matches said predetermined data pattern portion; and a second stage in which said timing offset is incremented at each iteration by a fine increment until said predetermined data pattern received in said receiving step matches said predetermined data pattern portion, wherein said timing offset is stepped back between said first stage and said second stage, such that said second stage at least partially repeats a timing offset range covered by a last iteration of said first stage.

The incrementation of the timing offset may advantageously be performed as a two stage process, in which coarse increments are made in the first stage and fine increments are made in the second stage. This enables the start of the predetermined pattern to be more quickly and efficiently determined. Coarse (i.e. greater) increments are used in the first stage to shift the received predetermined data pattern more quickly relative to the predetermined data pattern portion, and once a match has been found in this first stage the timing offset is stepped back from the latest coarse increment at which the match was found to begin the second stage in which fine (i.e. smaller) increments are made to determine the precise start position of the predetermined data pattern.

The coarse and fine increments could naturally be configured in a variety of different ways, but in one embodiment said coarse increment is 1/16 of a clock cycle, said fine increment is 1/256 of a clock cycle, said timing offset is stepped back 3/16 of a clock cycle between said first stage and said second stage.

Correspondingly, there are a number of ways in which the relative end timing values could be determined, but in one embodiment, determining said relative end timing value comprises:

comparing said sample of said predetermined data pattern received in said receiving step with a predetermined data pattern portion when said associated data strobe signal has a timing offset;

if said sample of said predetermined data pattern received in said receiving step matches said predetermined data pattern portion, incrementing said timing offset and repeating said receiving step; and determining said relative end timing value with reference to said timing offset when said sample of said predetermined data pattern received in said receiving step no longer matches said predetermined data pattern portion.

The determination of the relative end timing value (performed for each bit of the multi-bit data signal) can thus be performed by using a timing offset applied to the associated data strobe signal. An iterative process is performed in which this timing offset is incremented and the predetermined data pattern received by the differential receiver is compared to a predetermined data pattern portion. Accordingly, it will be understood that the predetermined data pattern portion need not be equivalent to the entirety of the predetermined data pattern transmitted to the differential data signal receiver, but may be only a subset thereof. The end of the predetermined data pattern is identified by incrementing the timing offset until the captured sample of the predetermined data pattern no longer matches the predetermined data pattern portion.

Hence in the above-mentioned example where the predetermined data pattern transmitted is an 8-bit burst of 0101010101, the data signal receiver may determine the end of the pattern by determining when the sample captured no longer matched the pre-stored value of 0101 (the predetermined data pattern portion).

In other words, after the start of the predetermined data pattern has been found, the relative timing of the sample of the predetermined data pattern received and the predetermined data pattern portion against which it is compared is adjusted in an incremental fashion until the two no longer match, thus giving a value of the timing offset for the associated data strobe signal corresponding to the end of the predetermined data pattern transmitted. Note that a relative end timing value is determined for each bit of the multi-bit data signal, but that the incrementing of the timing offset can be performed relative to all bits of the multi-bit data signal, such that in a single sweep of the timing offset value the relative end timing value for each bit may be determined.

In some embodiments said bit timing delay applied to each bit of said multi-bit data signal is initially set to a minimum value, said minimum value selected such that said sample of said predetermined data pattern received in said receiving step does not match said predetermined data pattern portion. Intentionally setting the bit timing delay applied to each bit of the multi-bit data signal in this way means that the comparison between the sample of the predetermined data pattern received and predetermined data pattern portion will initially fail, and only after further iterations of the process will samples start to match, meaning that the start of the data read eye can be reliably identified and a loss of eye opening is avoided.

In some embodiments said bit timing delay is configurable to take a range of values corresponding to a quarter clock cycle.

In some embodiments said strobe timing delay applied to said associated data strobe signal is initially set to a minimum value prior to carrying out the method.

In some embodiments said strobe timing delay may take a range of values corresponding to a full clock cycle.

In some embodiments if said bit timing delay for any bit of said multi-bit data signal is determined to exceed a predetermined maximum value, the method further comprises substituting said bit timing delay for each bit with a replacement bit timing delay and substituting said strobe timing delay with a replacement strobe timing delay, wherein said replacement bit timing delay for each bit is determined such that said starts of said predetermined data pattern for said multi-bit data signal are aligned; and said replacement strobe timing delay is determined to align said associated data strobe signal with a mid-way point between said aligned starts of said predetermined data pattern and an earliest relative end timing value amongst the bits of said multi-bit data signal.

Whilst it is preferable, for the reasons discussed above, for the read eyes of the multi-bit data signal to be aligned such that their respective centres are co-aligned and for the data strobe signal to be aligned with the same timing, it has further been recognised that situations may arise in which the bit timing delay required for at least one of the bits of the multi-bit data signal is too great for this to be possible. In such a situation, this embodiment provides that an alternative method for calibrating the system may be employed, namely one in which the starts of the respective data eyes are aligned. The data strobe signal is then aligned with a position half-way between these aligned starts and the earliest end of any of the data eyes of the multi-bit data signal i.e. mid-way along the shortest eye amongst the data eyes. This technique is referred to herein as the "minimal eye" mode and provides a useful fall-back position whereby calibration of the read data eye is nonetheless possible, despite not being possible to achieve according to the preferred method.

In some embodiments in which the "minimum eye mode" is employed, the method may further comprise outputting per-bit loss information derived from said replacement bit timing delay for each bit. This is particularly useful for diagnostic purposes, since the system operator is provided with information about any bit(s) of the multi-bit data signal which have been responsible for the system not being able to be calibrated according to the preferred "optimum eye" mode.

The per-bit loss information could be provided in a number of ways, but in one embodiment said per-bit loss information is determined as said replacement bit timing delay for each bit minus a quarter cycle where said replacement bit timing delay is greater than a quarter cycle, and is determined as zero where said replacement bit timing delay is less than or equal to a quarter cycle. Thus, in embodiments in which the maximum bit timing delay applicable to any bit is a quarter cycle, this arrangement provides that "zero" per-bit loss information is reported for any bits of the multi-bit data signal which are within the adjustment capabilities of this quarter cycle, but any which exceed this are reported to the extent that they exceed the quarter cycle limit In some embodiments said steps of receiving said sample of a predetermined data pattern, determining said relative start timing value and determining said relative end timing value are repeated to determine average values for said relative start timing value and said relative end timing value. Due to factors such as the inherent system jitter, PCB trace skew, DRM uncertainty and so on, it may occur that although the predetermined data pattern is correctly identified and calibrated for in a single iteration of the calibration method, the subsequent data capturing by the differential data receiver may fail as a result of only a small variation in the data strobe timing. Accordingly, a more reliable data strobe timing determination is made by repeating the calibration process over a number of cycles and determining average values for the start and end timing values for each bit, which correspondingly feeds into an average determination of the mid-point value timing values and the corresponding final calibration.

Whilst the sample of the predetermined data patterns received could correspond to all data bits captured in the receiving step, in some embodiments said receiving step comprises capturing a predetermined number of data bits and said sample is selected as less than all of said predetermined number of data bits. For example in one embodiment said predetermined number of data bits is eight and said sample is selected as four data bits. In one particular embodiment said four data bits are a middle four data bits of said predetermined number of data bits. Noise on the printed circuit board only significantly affects the first and last bits and hence a "clean" sample is achieved by the selection of the middle four data bits.

In some embodiments the method further comprises requiring a minimum predetermined pattern length between said relative start timing value and said relative end timing value.

In one embodiment said data signal receiver is a DDR DRAM controller.

Viewed from a second aspect the present invention provides a computer program product storing in non-transient fashion a computer program configured to cause the execution of the method of the first aspect.

Viewed from a third aspect the present invention provides a data signal receiver configured to receive a multi-bit data signal and an associated data strobe signal, wherein transitions of said data strobe signal indicate sample points for said multi-bit data signal, the data signal receiver configured to perform a calibration process and comprising:

a receiver configured to receive, on each bit of said multi-bit data signal, a sample of a predetermined data pattern;

a timing calculator configured to determine, for each bit of said multi-bit data signal, a relative start timing value indicative of a start of said predetermined data pattern, said timing calculator configured to determine, for each bit of said multi-bit data signal, a relative end timing value indicative of an end of said predetermined data pattern, and said timing calculator configured to determine, for each bit of said multi-bit data signal, a mid-point timing value halfway between said relative start timing value and said relative end timing value;

bit timing delay circuitry configured to apply a bit timing delay to each bit of said multi-bit data signal such that the mid-point timing values are aligned; and strobe timing delay circuitry configured apply a strobe timing delay to said associated data strobe signal to align said associated data strobe signal with the aligned mid-point timing values.

Viewed from a fourth aspect the present invention provides a data signal receiver configured to receive a multi-bit data signal and an associated data strobe signal, wherein transitions of said data strobe signal indicate sample points for said multi-bit data signal, the data signal receiver configured to perform a calibration process and comprising:

means for receiving, on each bit of said multi-bit data signal, a sample of a predetermined data pattern;

means for determining, for each bit of said multi-bit data signal, a relative start timing value indicative of a start of said predetermined data pattern;

means for determining, for each bit of said multi-bit data signal, a relative end timing value indicative of an end of said predetermined data pattern;

means for determining, for each bit of said multi-bit data signal, a mid-point timing value halfway between said relative start timing value and said relative end timing value;

means for applying a bit timing delay to each bit of said multi-bit data signal such that the mid-point timing values are aligned; and means for applying a strobe timing delay to said associated data strobe signal to align said associated data strobe signal with the aligned mid-point timing values.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
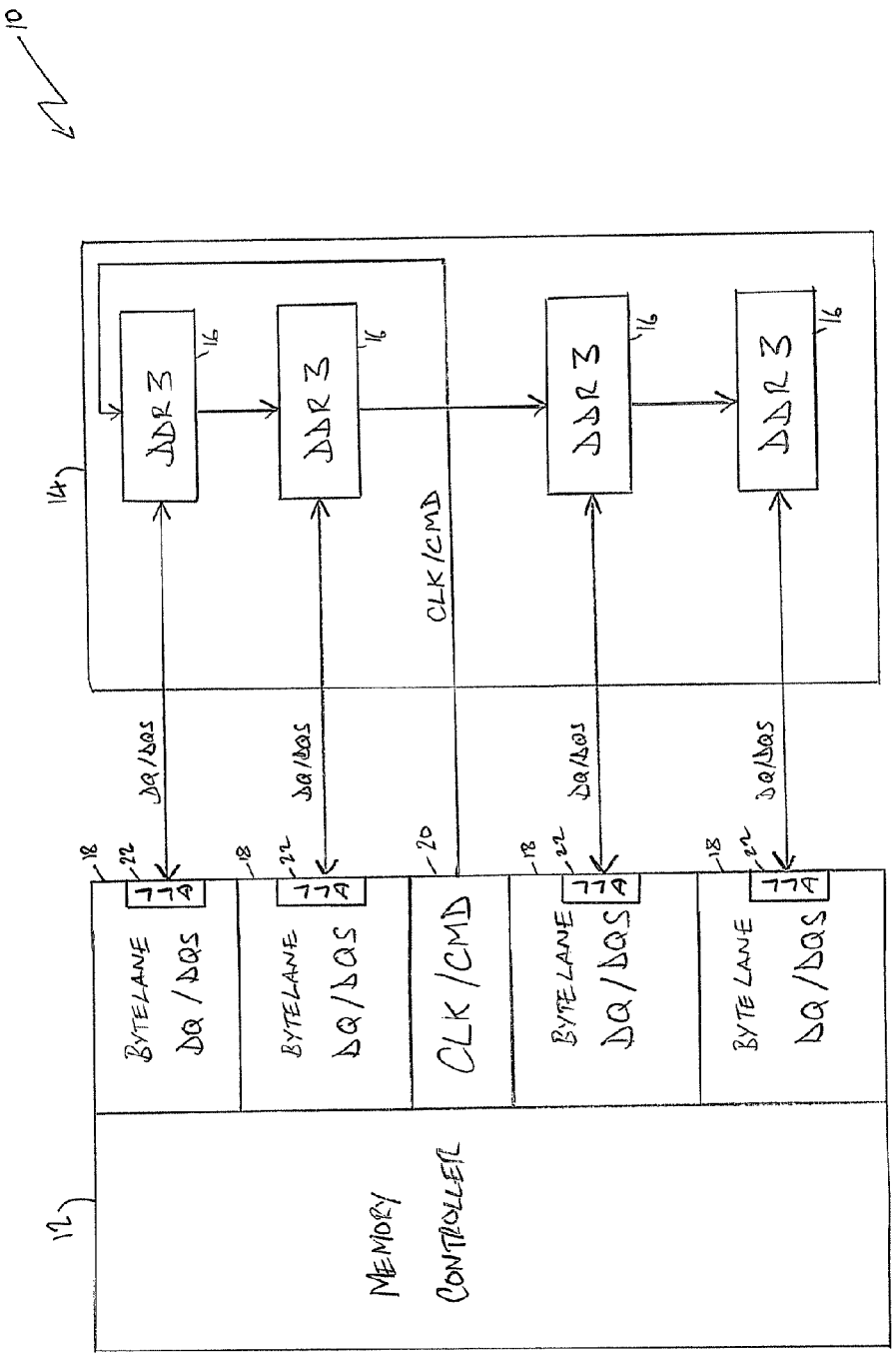
FIG. 1 schematically illustrates a dual data rate DRAM system in which a memory controller controls access to four DDR3 modules in one embodiment.

FIG. 1 schematically illustrates a DDR memory system 10, which generally comprises a memory controller integrated circuit 12 and a memory module integrated circuit 14. The memory module integrated circuit 14 comprises four DDR3 modules 16, each of which may be accessed in parallel by its own dedicated bytelane 18 provided as part of the memory controller integrated circuit 12. The memory controller integrated circuit 12 further comprises a clock/command (CLK/CMD) module 20 which is configured to transmit clock and command signals to the DDR3 modules 16. In the illustrated embodiment shown in FIG. 1, the CLK/CMD signals are transmitted between the DDR3 modules in a "fly-by" configuration to improve signal integrity (avoiding the reflections associated with a branching topology). Accordingly, the memory controller 12 can cause data to be read from one of the DDR3 modules 16 by issuing appropriate command (CMD) signals via the CLK/CMD path (in association with the clock signal CLK which is also transmitted via that route), the requested data being returned from the corresponding DDR3 module via its associated DQ/DQS path to the corresponding bytelane 18 of the memory controller 12. Equally, the memory controller 12 can cause data to be written to one of the DDR3 modules 16 by issuing appropriate command (CMD) signals via the CLK/CMD path, the write data being transmitted from the respective bytelane 18 of the memory controller 12 to the corresponding DDR3 module via its associated DQ/DQS path.

In a read configuration, in order for the memory controller 12 to be able to correctly interpret the data transmitted as the DQ signal, it is necessary for the relative timing of the DQS signal to be correctly calibrated, since the data strobe signal DQS indicates the sample points at which the DQ signal should be sampled by the receiver. Each bytelane further comprises a set of delay-locked loop (DLL) logic 22 enabling these relative timings to be adjusted under the overall control of the memory controller 12.

Figure 4A:
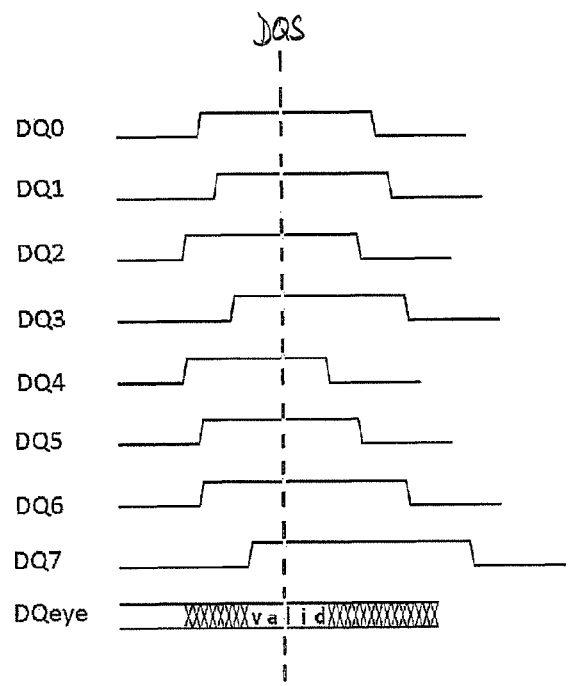
FIG. 4A schematically illustrates example relative timing of eight DQ bits and the resulting DQ eye prior to any timing adjustments being applied.

FIG. 4A illustrates example timings of set of eight bits of a DQ signal which may be carried on the DQ path from a DDR memory module to its corresponding bytelane (see FIG. 1). Specifically, FIG. 4A shows the DQ[7:0] bits at the PHY inputs from the DRAM after PCB trace. In this situation, whilst the relevant DLL logic 22 could be configured to adjust the relative timing of the DQS signal (dashed line in FIG. 4A) to position the DQS centrally in the DQ read eye ("DQeye" in FIG. 4A) without other calibration being performed, the limited size of the read eye means that the data signal receiver (i.e. the corresponding bytelane 18 in memory controller 12) would have very little operating margin and would frequently fail to correctly read data according to such a calibration technique.

Figure 2A:
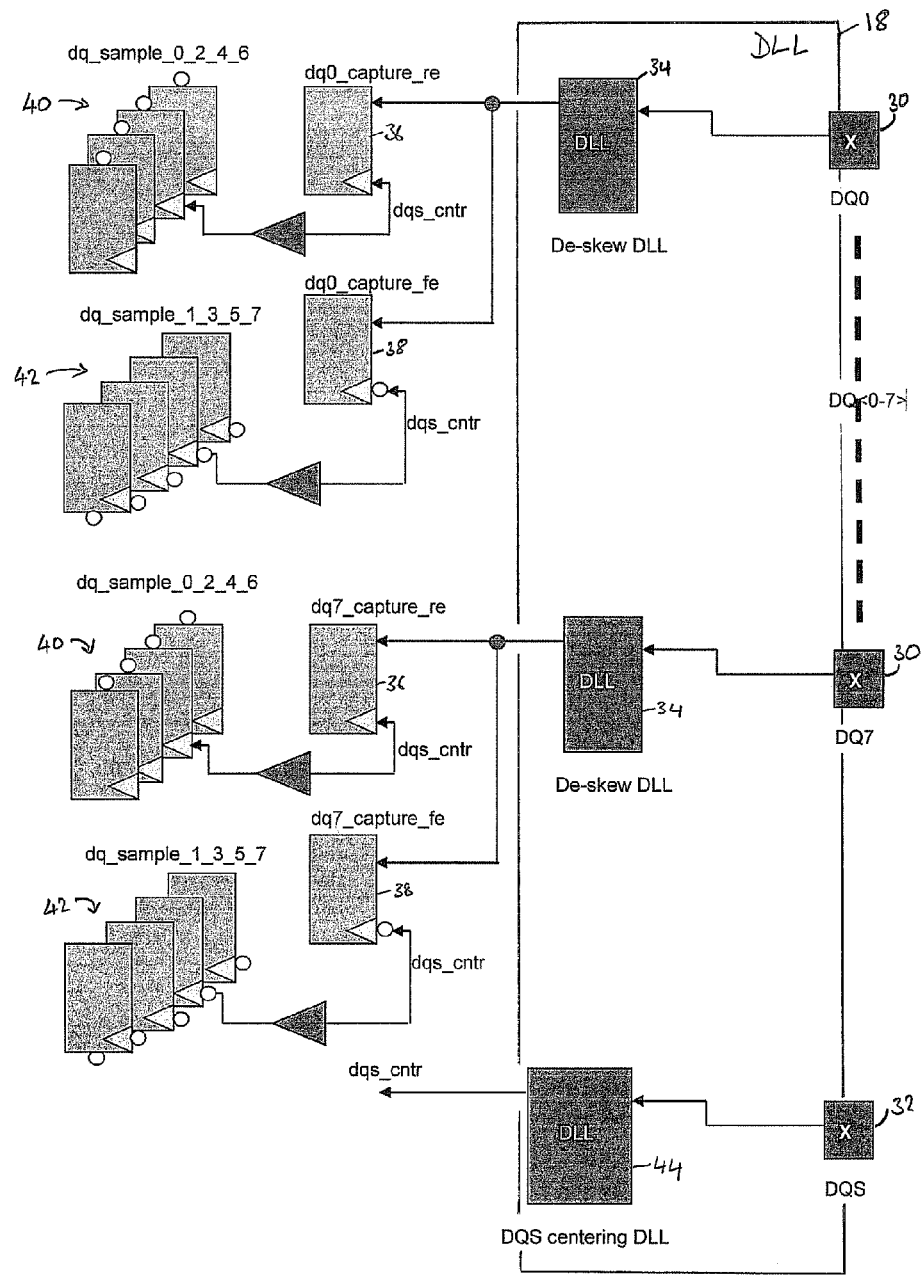
FIG. 2A schematically illustrates delay-locked loop (DLL) logic of each bytelane shown in FIG. 1.

Further detail of the delay-locked loop (DLL) logic 22 provided in each bytelane 18 is schematically illustrated in FIG. 2A. The data flow begins at the right hand side of the figure where the PHY inputs 30 for DQ0 and DQ7 and for the DQS signal 32 are shown. Further DQ inputs for DQ1-DQ6 are omitted from the figure for clarity of illustration only. Specifically, the DLL 22 (see FIG. 1) in each bytelane comprises a de-skew DLL 34 provided for each bit of the corresponding DQ signal, together with a DQS centering DLL 44 by means of which the timing of the DQS signal may be adjusted. Also illustrated in FIG. 2A are the sets of flops 36, 38, 40, 42 associated with each DQ bit, which the bytelane DQ/DQS modules 18 use as part of the calibration procedure for the DLL units 34, 44. These flops comprise, for each DQ bit, a rising edge capturing flop 36 and a falling edge capturing flop 38. Further, sampling flops 40 are configured to hold samples from a sequence of rising edges (labelled 0, 2, 4, 6), whilst sampling flops 42 are configured to hold samples from a sequence of falling edges (labelled 1, 3, 5, 7). As will be described in more detail in the following, these sampling flops are used to capture samples of a fixed pattern of data which is returned from the DRAM modules during the read eye calibration procedure.

Figure 2B:
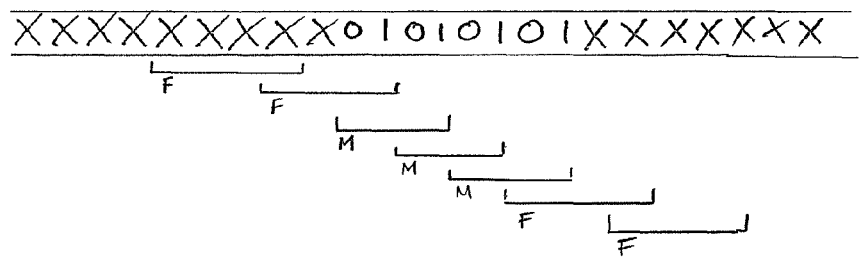
FIG. 2B schematically illustrates the sampling of four bits at different timing offsets with respect to a transmitted predetermined data pattern.

FIG. 2B schematically illustrates the principle of examining 4-bit samples taken with respect to a transmitted predetermined data sequence of 0101010101. Where a pattern in the 4-bit sample of 0101 is looked for, as shown in the figure the relative timing of the sample and the predetermined data sequence will determine whether a match is found ("F" indicating a failed match and "M" indicating a successful match). Accordingly, by using the DQS centering DLL (44 in FIG. 2A) to sweep through a range of relative timings, the starting point (where the first match occurs) and the end point (where the matching begins to fail) of the predetermined data sequence can be found.

Figure 2C:
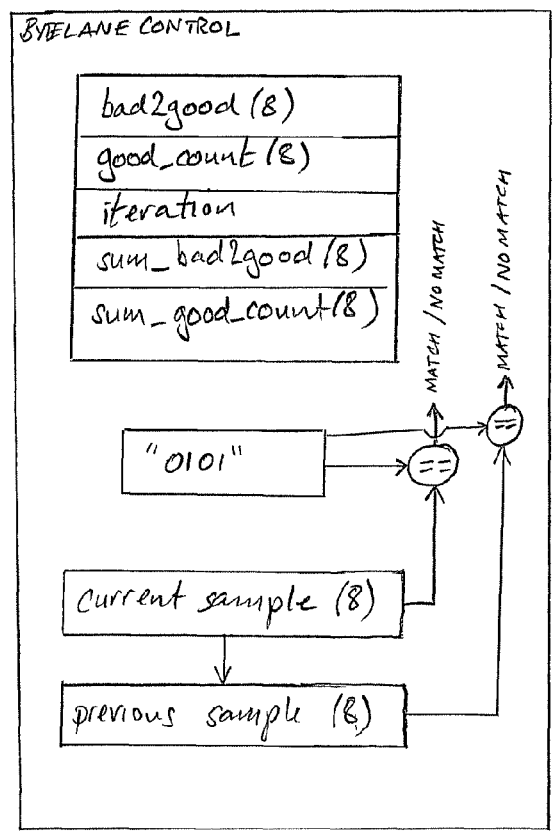
FIG. 2C schematically illustrates example registers and comparators which are provided in a bytelane controller in one embodiment.

FIG. 2C schematically illustrates some registers and comparators which may be provided within a bytelane controller associated with each bytelane 18 in one embodiment. Four 8-entry registers (bad2good, good_count, sum_bad2good and sum_good_count) and one single entry register (iteration) are provided for tracking various quantities in the calibration process. Also a "current sample" register and "previous sample" register (each also being 8-entry) are provided to allow comparison with a pre-stored comparison value (here being 0101). The "current sample" and "previous sample" registers are configured such that the content of the "current sample" register is transferred to the "previous sample" after each iteration.

FIG. 3A to FIG. 3I illustrate a sequence of steps which are taken in one embodiment when carrying out a read data eye training procedure by which the DLL logic 22 of each bytelane 18 of the memory controller 12 is calibrated. The procedure begins with some initiation steps. Firstly (at step 100) all de-skew DLL logic 34 are set to a maximum of a quarter clock cycle. In other words, the bit timing delay applied to each bit is set to a minimum possible value (setting the bit timing in advance by 90 degrees of its default position) with respect to the overall offset provided by the read centering DLL. At step 102 the read centering DLL 44 in each bytelane is also set to an initiation value of zero. At step 104 the first_search flag is set to 1, indicating that an initial coarse search should be performed in which it is checked if any of the DQ bit (middle four bits) samples match the required 0101 pattern in iterative DLL steps of 1/16 cycle. At step 106 the various DQ registers used during the following calibration procedure are all set to 0 (bad2good, good_count, iteration, sum_bad2good and sum_good_count). Then, at step 108 the memory controller 12 configures (via the appropriate signal on the CMD path) the DRAM modules 16 into MPR (multi-purpose register) read mode in which a predetermined data pattern will be returned on all DQ lines.

At step 110 all sampling flops 36, 38, 40, 42 are reset, the rising edge flops being reset to 1 and the falling edge flops being reset to 0. Then at step 112, the memory controller 12 instructs the DRAM modules to read data from the MPR in BL8 mode (burst length 8) and at step 114 waits for the read data to return. When the read data has been captured by the respective bytelane, for the purposes of the calibration procedure at step 116 the middle four samples for each DQ bit (i.e. numbered 2, 3, 4, 5) are loaded into a register for evaluation and that evaluation begins at step 118. The evaluation is described in more detail in FIGS. 3B-3I. On subsequent iterations of step 116, the current 4-bit sample is transferred to a "previous 4-bit sample" register whilst the newly sampled data provides the content of a "current 4-bit sample" register, the content of the two being compared in subsequent steps as described in more detail below.

The detailed steps of the evaluation process (beginning at step 120) which are taken in one embodiment when carrying out the read data eye training procedure are shown in FIGS. 3B-3I. At step 122 it is determined if the first_search flag is currently set to one, indicating that none of the samples for the DQ bits have yet been found to match the searched for "0101" pattern. Whilst this is the case, the flow proceeds to step 124, where it is checked if (at this iteration) any of the DQ bits has a 0101 sample. If no such sample has been captured for any of the DQ bits then the flow proceeds to step 126, where it is checked that the incremental steps through the DLL (i.e. through the DQS centering DLL in each bytelane) has not reached its maximum. If it has not, then at step 128 the DLL step is incremented by 1/16 cycle and the flow returns to step 110 (see FIG. 3A) for the next iteration of the initial coarse search to be performed.

In the event that the DLL step is determined to have reached its maximum at step 126 then the procedure has unexpectedly failed and the full sweep in DLL has been performed without finding a matching 0101 sample. In this situation the process exits with a failed status (see steps 130 and 132). Accordingly, the initial coarse search (first_search=1) continues in 1/16 cycle steps through the DQS centering DLL until at least one of the DQ bits is found to have provided a 0101 sample. Once this occurs (determined at step 124) the flow proceeds to step 134 where the first_search flag is reset to zero, indicating the conclusion of the coarse search. At step 136 the centering DLL is stepped back by 3/16 cycle for the fine search to begin and the flow returns to step 110 (see FIG. 3A).

Figure 3A:
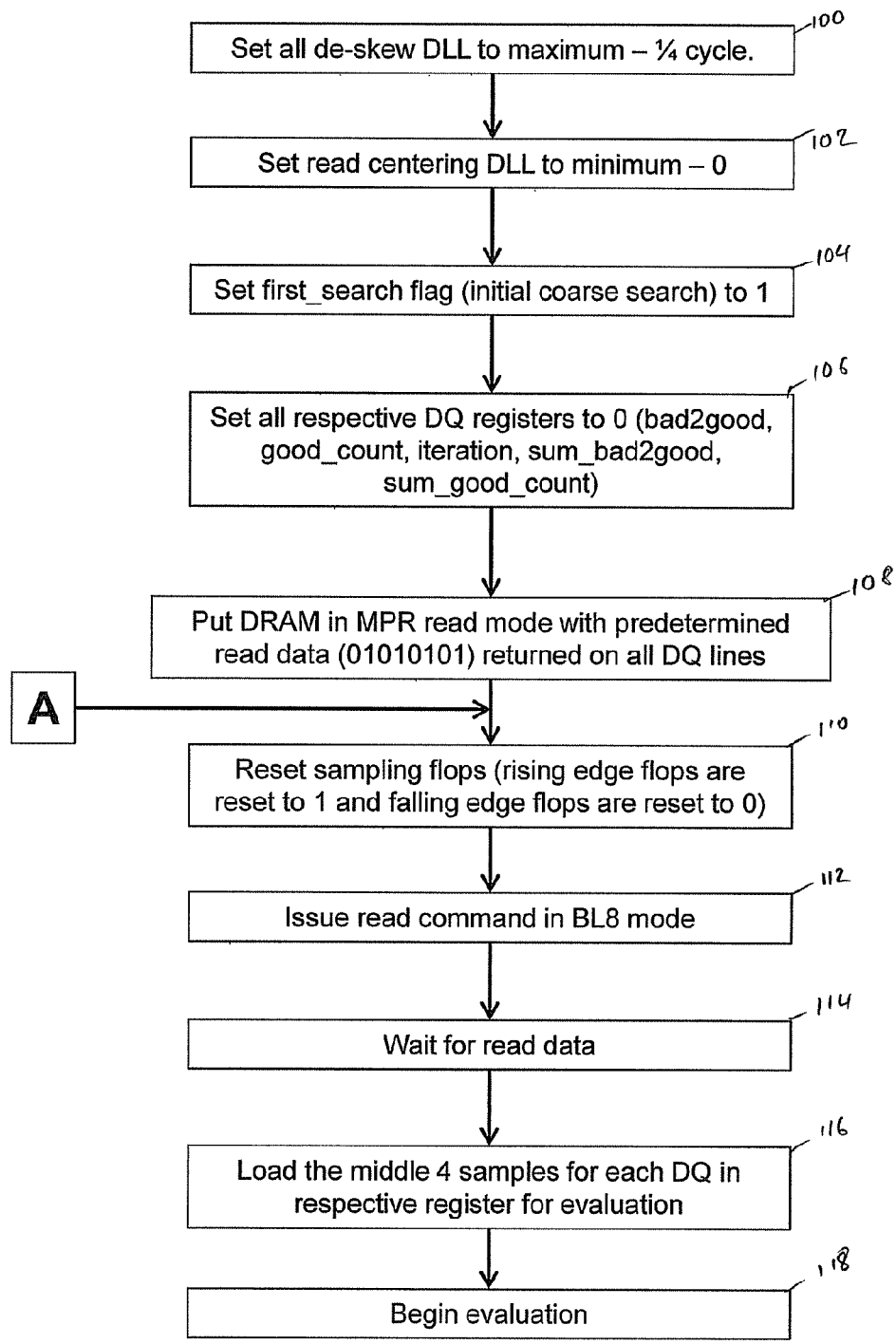
FIGS. 3A-I schematically illustrate a series of steps taken in one embodiment in which a read eye training (calibration) procedure is carried out.
Figure 3B:
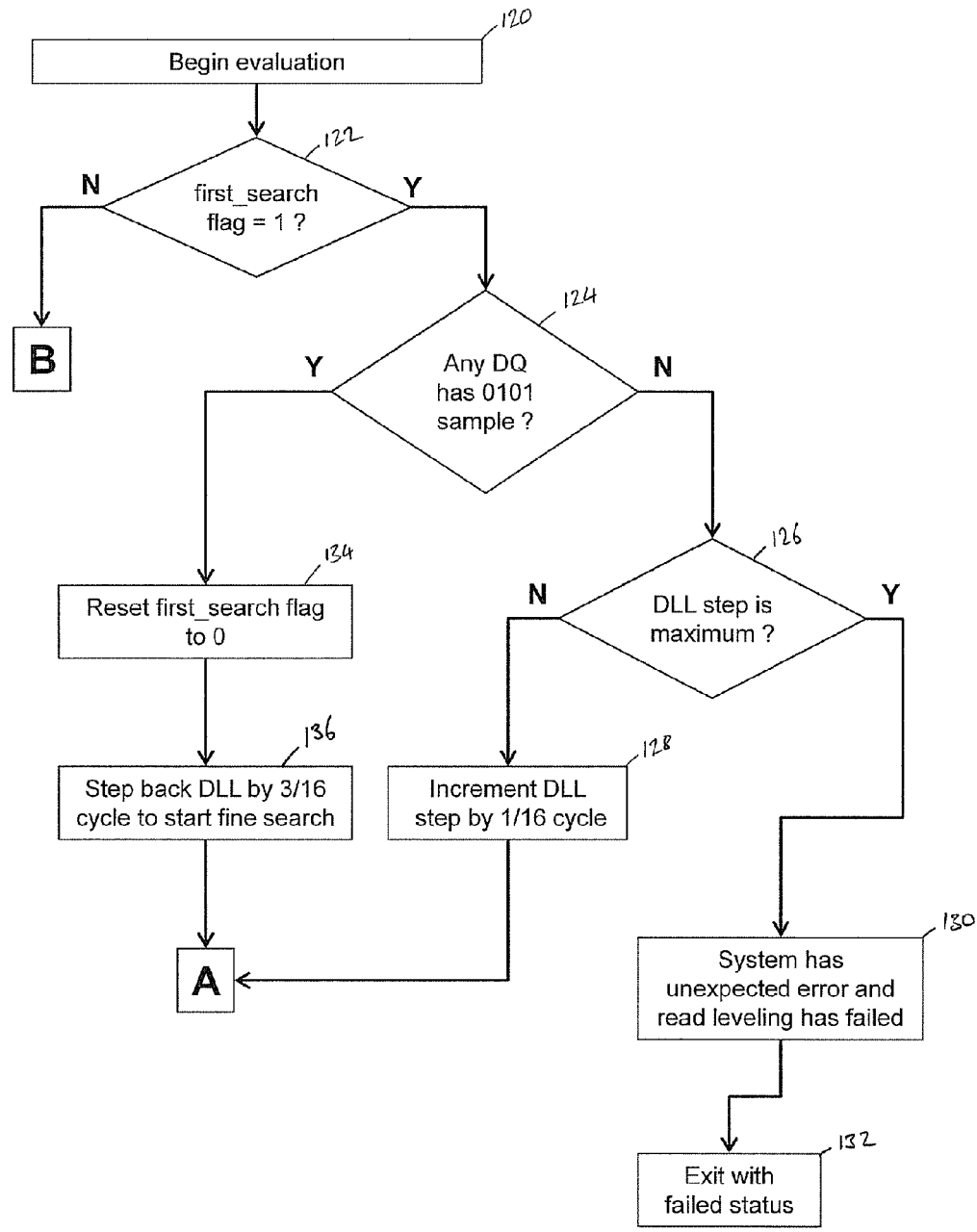
Figure 3C:
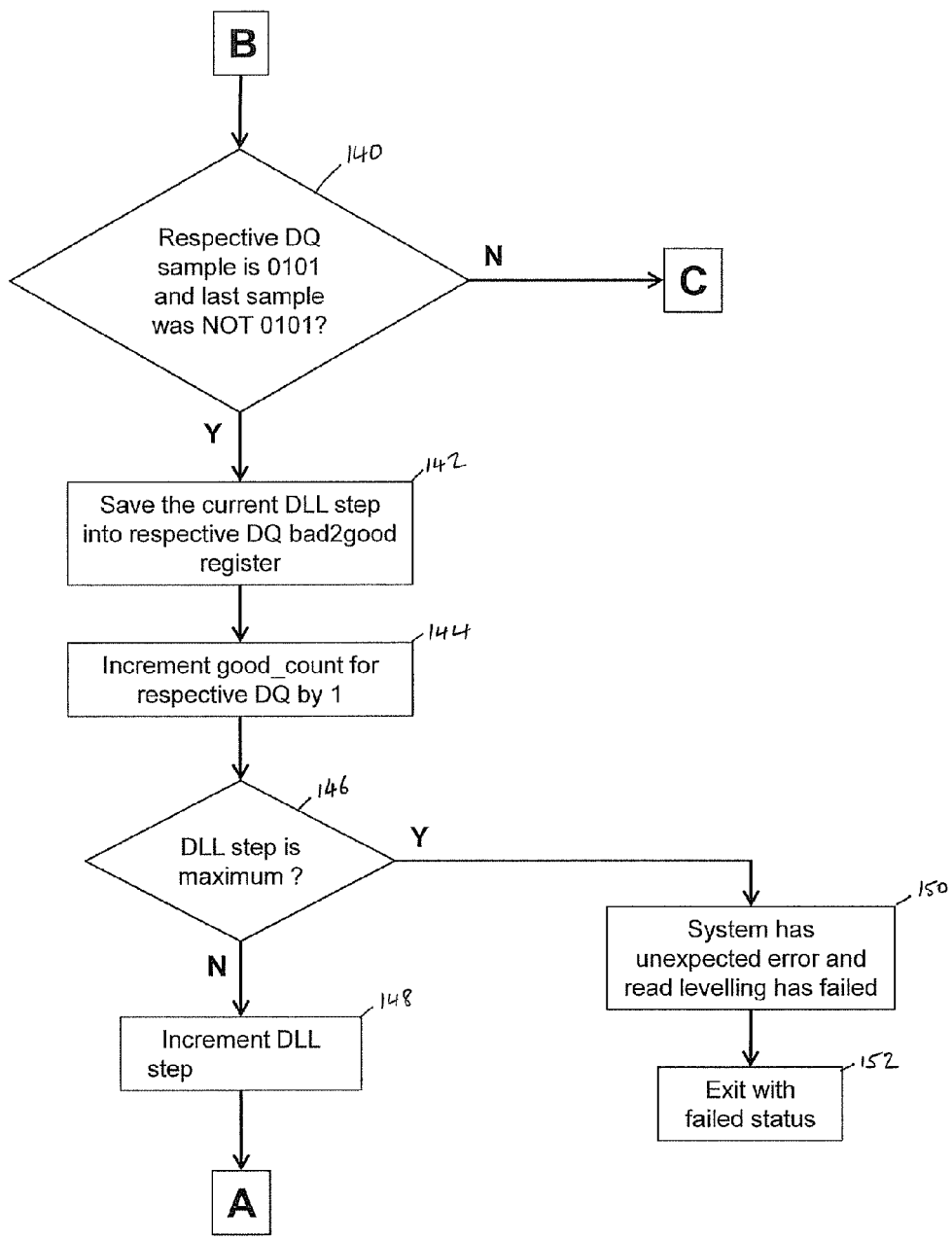
Figure 3D:
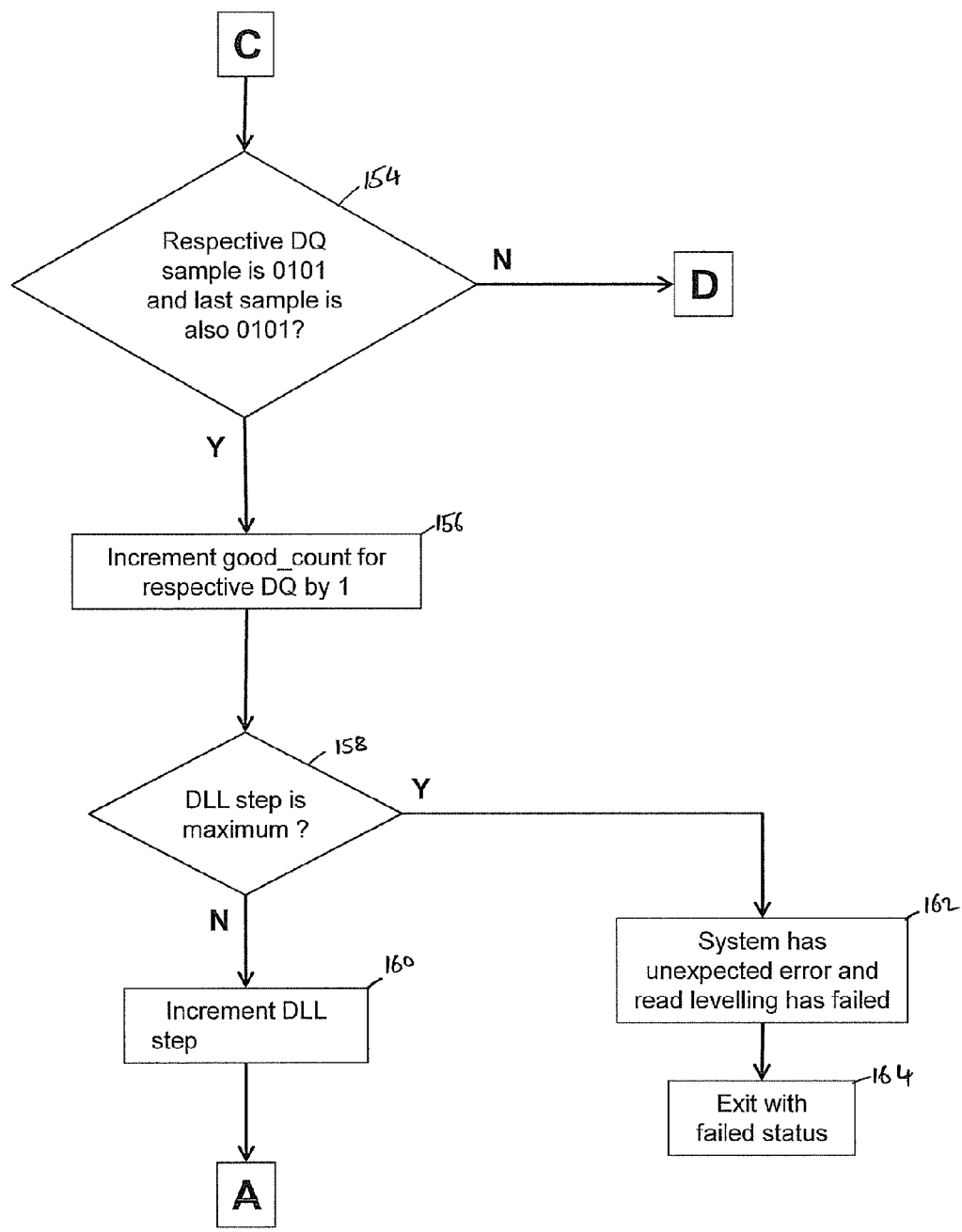
Figure 3E:
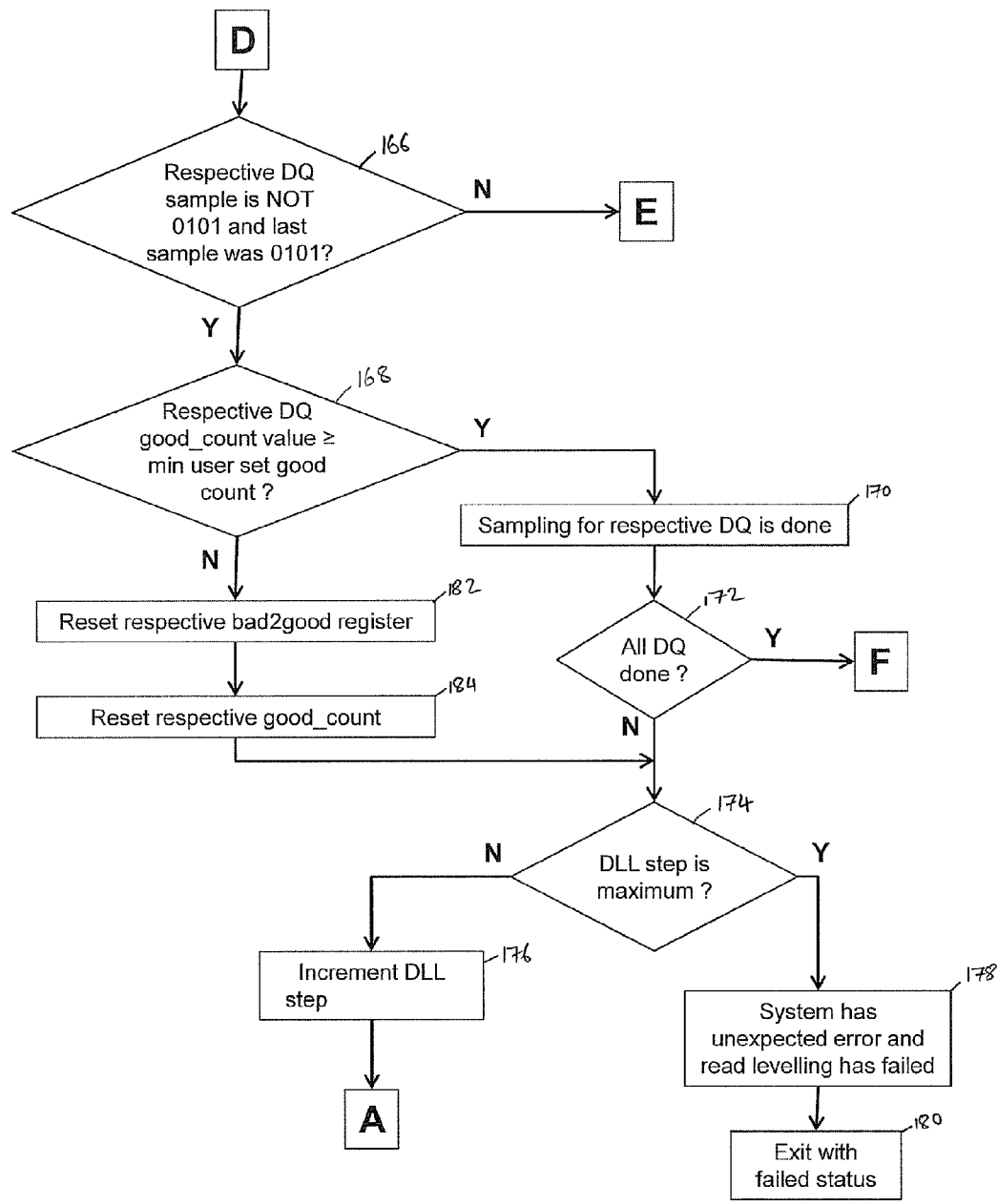
Figure 3F:
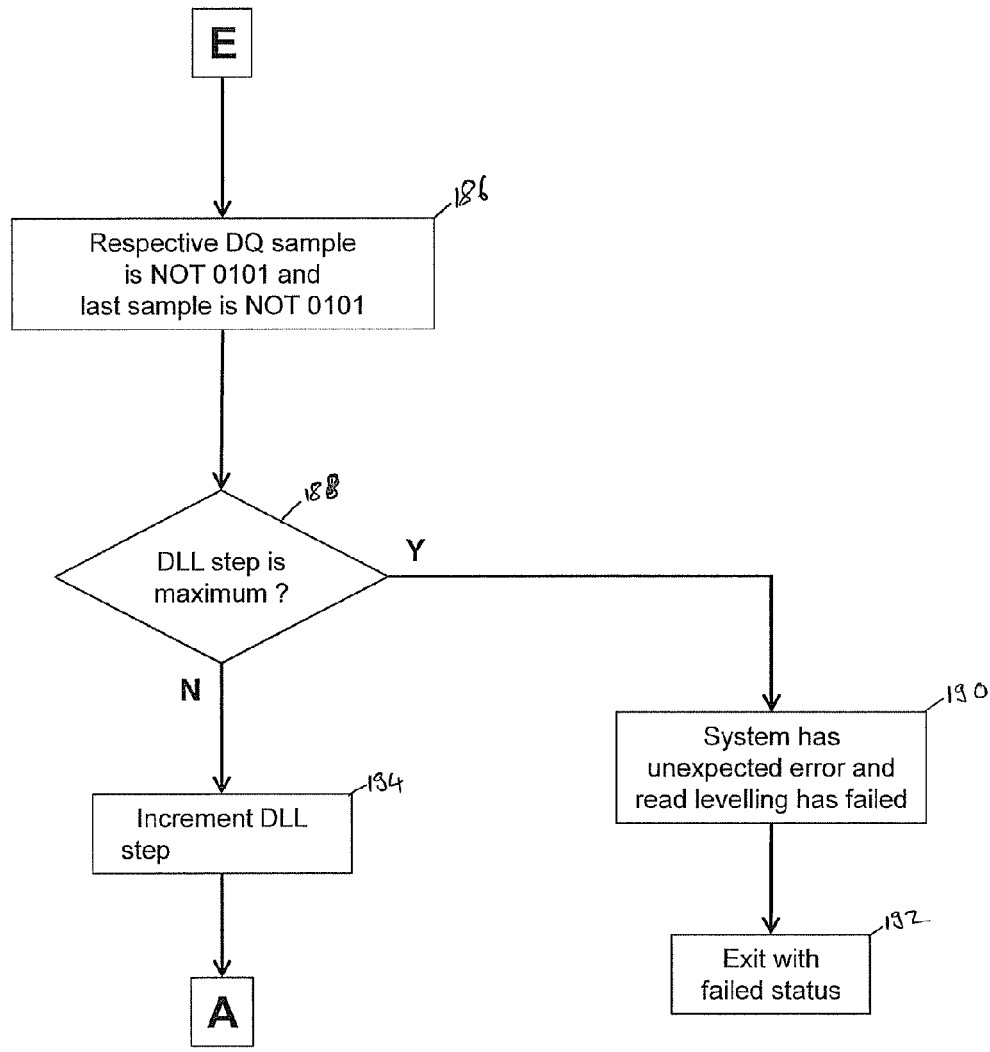

Thus on the next iteration which reaches step 122, the first_search flag will be found to be set to zero and the "no" path from step 122 is followed, leading to step 140 (see FIG. 3C). Here, in the fine search, it is first sought to determine the point, for each DQ bit, where the first 0101 sample is found (as the sweep through in the centering DLL is performed). At step 140 it is determined (for each DQ bit) if the respective current DQ sample is 0101 and the last sample for this DQ bit was not 0101. When this is the case, the flow proceeds to step 142 where the current DLL step is saved into the respective bad2good register entry corresponding to this DQ bit. Then at step 144 the good_count entry for the respective DQ bit is incremented by 1. At step 146 it is determined if the DLL step is at its maximum and if it is then (step 150 and 152) the system has an unexpected error and the read levelling has failed. If however further iterations of DLL steps are possible, then at step 148 the DLL is incremented (in this example embodiment in steps of 1/255 of a clock cycle) and the flow returns to step 110 (see FIG. 3A). When, at step 140 it is determined that for a given DQ bit, the "current sample is 0101, previous sample not equal to 0101" condition is not satisfied, then the flow proceeds to step 154 (see FIG. 3D).

At step 154 it is determined, for each DQ bit, if the respective current DQ sample is 0101 and the previous sample was also 0101. In other words, it is tested if, for this DQ bit, the current DLL offset is selecting a position part way through the transmitted predetermined data pattern. Whilst this is the case the flow proceeds to step 156 where the good_count value for the corresponding DQ bit is incremented by one. Following this, at step 158 it is determined if the DLL step has already reached its maximum and this being the case then (step 162 and 164) the system has unexpectedly failed (by reaching the end of the possible DLL offset without identifying the end of the predetermined data pattern) and the process exits. If however further DLL steps are possible then the flow proceeds via step 160 where the DLL step is incremented and the flow returns to step 110 (see FIG. 3A). Alternatively, if at step 154 it is determined that the "both current and previous sample equals 0101" condition is not met then the flow proceeds to step 166 (see FIG. 3E).

At step 166 it is determined, for each DQ bit, if the respective current DQ sample is not 0101 and the last sample was 0101. In other words, it is tested, for each DQ bit, if the end of predetermined data pattern has been reached. When this point is found for a DQ bit, the flow proceeds to step 168 where it is verified if, for this DQ bit, the respective good_count value is at least the minimum good_count value set by the user, i.e. if a sufficient length of data pattern has been identified for this DQ bit. The minimum good_count is user programmable according to the particular system requirements, but this may for example be set at 50% of the ideal eye.

Figure 3G:
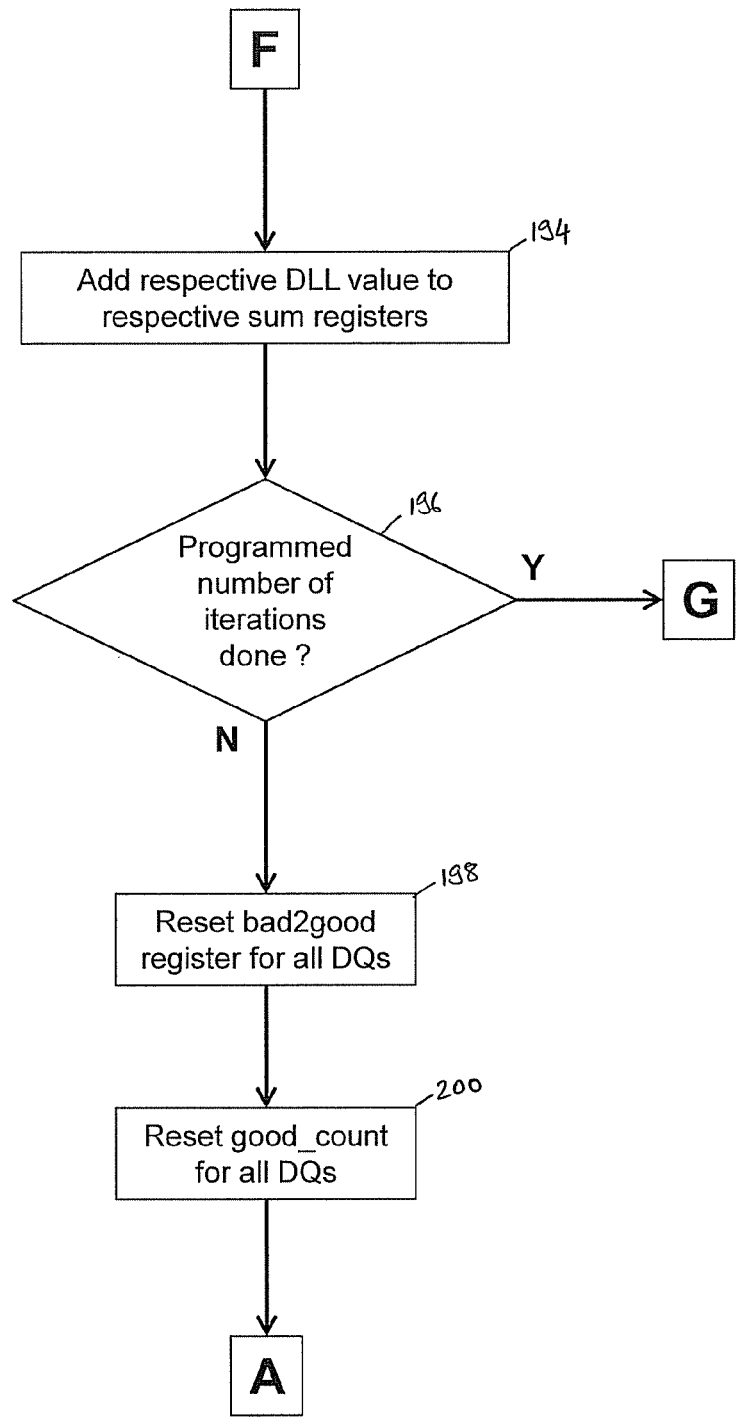
Figure 3H:
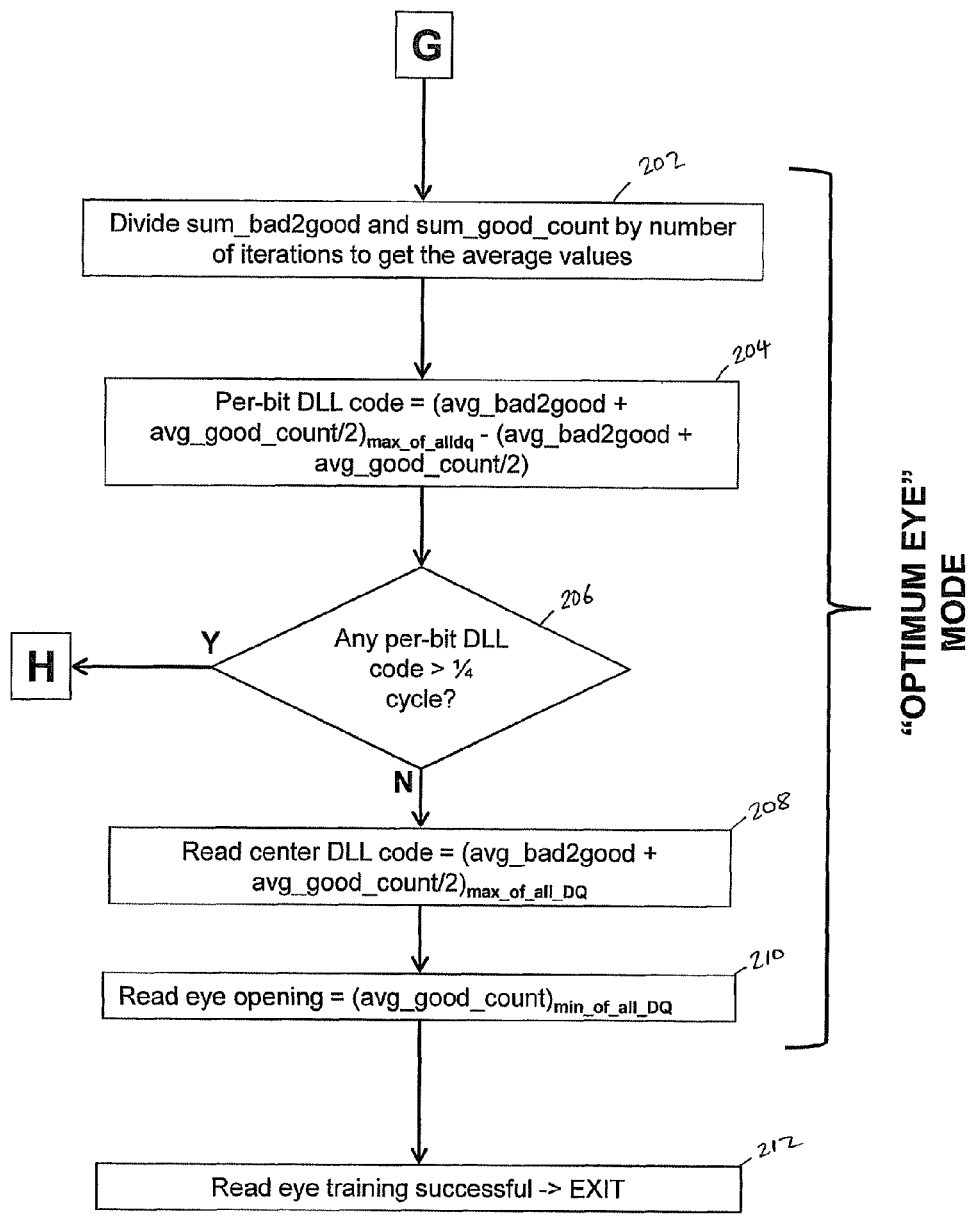
Figure 3I:
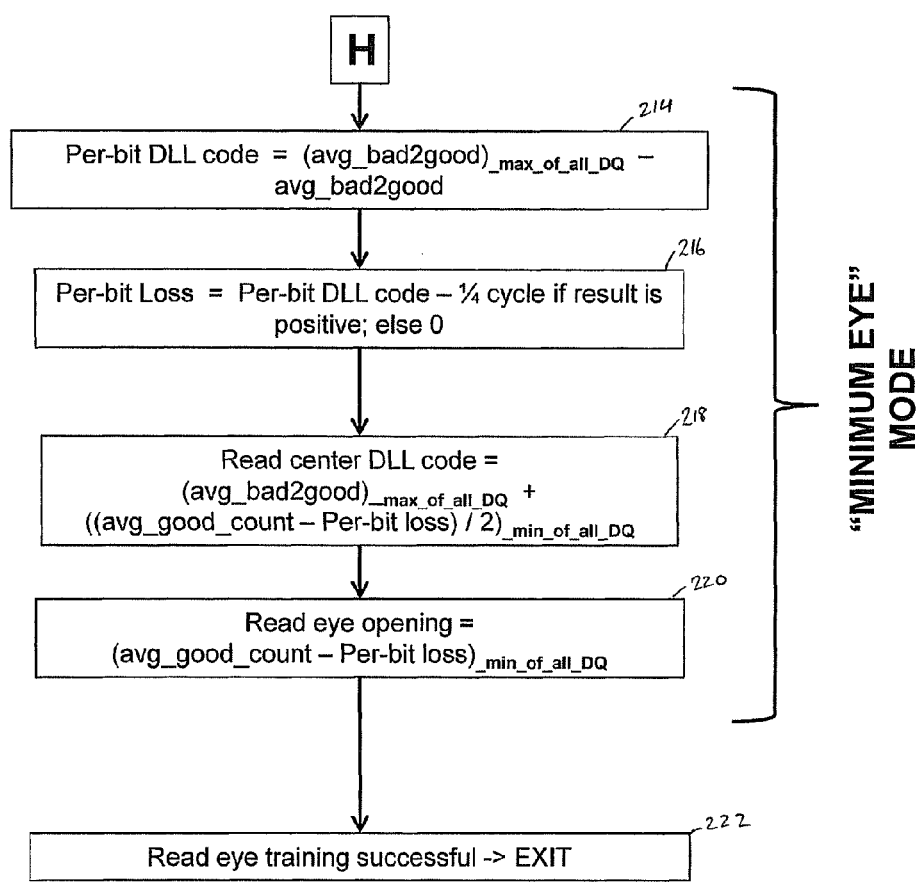

If this condition is satisfied then (step 170) the sampling for this DQ bit is completed and at step 172 if the sampling for all DQ bits is completed then the flow proceeds to step 194 (see FIG. 3G). If however other DQ bits still have further sampling to be performed then (if further DLL steps are available (step 174)), the DLL step is incremented at step 176 and the flow returns to step 110 (see FIG. 3A). If it is determined at step 174 that the DLL step is at its maximum then the flow proceeds to steps 178 and 180 since the system has an unexpected error (in that the DLL has reached its maximum before the end point for all DQ bits have been found) and the read levelling process has failed.

At step 168 if, on the other hand, the minimum user set good_count has not been achieved then the flow proceeds to step 182 where the respective bad2good register entry is reset and step 184 where the respective good_count value is reset, indicating that the previously identified sample(s) which matched 0101 was/were insufficient to be identified as the predetermined data pattern sequence and further 0101 samples are searched for on this DQ bit, the flow proceeding to step 174.

If at step 166 the "current sample not 0101, last sample is 0101" condition is not met then (by process of elimination) neither the current sample nor the previous sample matched 0101 (step 186). In this situation as long as the DLL step has not reached its maximum (step 188) then at step 194 the DLL is incremented and the flow returns to step 110 (see FIG. 3A). If at step 188 the DLL has reached its maximum then the system has an unexpected error and the read levelling has failed, exiting with a failed status (steps 190 and 192).

Turning to FIG. 3G, step 194 is reached if it is determined at step 172 (see FIG. 3E) that the sampling for all DQ bits has been successfully completed on this sweep of the DLL. At step 194 the respective DLL value is added, for each DQ bit, to the respective sum registers (i.e. sum_bad2good and sum_good_count). Then at step 196 it is determined if the program number of iterations over which the averaging process is to be carried out have been completed. If they have not then at step 198 the bad2good register for all DQ bits are reset and at step 200 the good_count register for all DQ bits is also reset. The flow then returns to step 110 (see FIG. 3A) for these further iterations to be done. If however at step 196 it is determined that the programmed number iterations have completed, then the flow proceeds to step 202 (see FIG. 3H).

At step 202 the sum_bad2good and sum_good_count values (for each DQ bit) are divided by the number of iterations carried out to get their average values. Then, at step 204, the calibrated setting for each de-skew DDL (a "per-bit DLL code") is determined as:

Per-bit DLL code=(avg_bad2good+avg_good_count/2)$_{max\_of\_alldq}$−(avg_bad2good+avg_good_count/2)

In other words, the averaged mid-point for a given DQ bit (avg_bad2good+avg_good_count/2) is subtracted from the maximum value of this quantity found across all DQ bits.

At step 206 it is determined if any per-bit DLL code has been evaluated as greater than a quarter clock cycle. If it is then the "optimum eye" method shown in FIG. 3H cannot be completed and the flow proceeds to step 214 (see FIG. 3I). If however all per-bit DLL codes are within this quarter cycle limit then the flow proceeds to step 208 where the calibration for the DQS centering DLL ("read center DLL code") if determined as:

Read center DLL code=(avg_bad2good+avg_good_count/2)$_{max\_of\_all\_DQ}$

In other words, this is the largest value determined for all DQ bits of the averaged mid-point of the read eyes found. Finally, at step 210 the read eye opening is determined as the minimum (across the DQ bits) of the averaged good_count values. The process concludes at step 212 where the read eye training has successfully completed. The training can be performed for each chip-select present in the system based on requirement.

In the event that the optimum eye mode cannot be successfully completed (at least one per-bit DLL code is greater than a quarter cycle) then the flow proceeds to step 214. Here, a replacement per-bit DLL code is determined as:

Per-bit DLL code=(avg_bad2good)$_{max\_of\_all\_DQ}$−avg_bad2good, i.e. the difference between the averaged start position for this bit and the latest averaged start position for all DQ bits. Then at step 216 a per-bit loss value is determined as the per-bit DLL code less a quarter cycle if this value is positive, otherwise zero. In other words if the per-bit DLL code is less than a quarter cycle then there is no per-bit loss, otherwise the per-bit loss quantifies the "excess" over a quarter cycle which could not be adjusted for. This per-bit DLL code is used for system debugging. At step 218 the read centre DLL code is determined as:

Read center DLL code=(avg_bad2good)$_{max\_of\_all\_DQ}$+((avg_good_count−Per-bit loss)/2)$_{min\_of\_all\_DQ}$ In other words the centering position is determined with respect to the latest eye opening for any DQ bit, offset by half the smallest read eye opening for any DQ bit.

Finally, at step 220 the overall read eye opening may be determined as the minimum across all DQ bits of the average good_count minus the per-bit loss. The flow concludes at step 222, where the read eye training has been successfully completed according to the "minimum eye" mode.

Figure 4B:
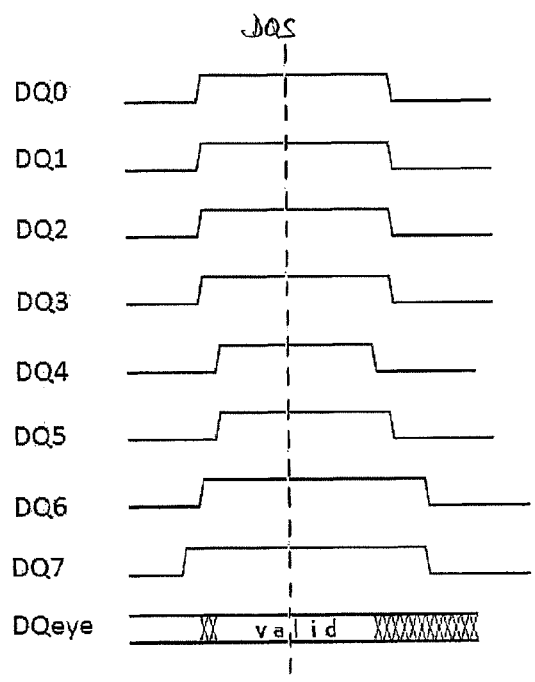
FIG. 4B schematically illustrates example relative timing of eight DQ bits and the resulting DQ read eye after calibration in one embodiment.

FIGS. 4A-4D illustrate example relative timings of 8 DQ bits and the resulting read eye related to various different stages of the above-discussed calibration process. FIG. 4A shows the 8 DQ bits at the PHY inputs from the DRAM after PCB trace. Because of the lack of alignment between the respective DQ bits the resulting DQ read eye has a limited opening (where labelled "valid") and therefore the system will have an equivalently limited operating margin to correctly read the corresponding data when transmitted in this configuration. FIG. 4B shows the same set of DQ bits after a per-bit de-skew calibration has been carried out according to the "optimum eye" mode described above. It can be seen that the DQ bits have been adjusted to have a common centre (with which the DQS strobe has been aligned), resulting in an improved read eye opening and DQS centering with respect to all DQ bits, thus improving the setup and hold margin across all DQ bits.

Figure 4C:
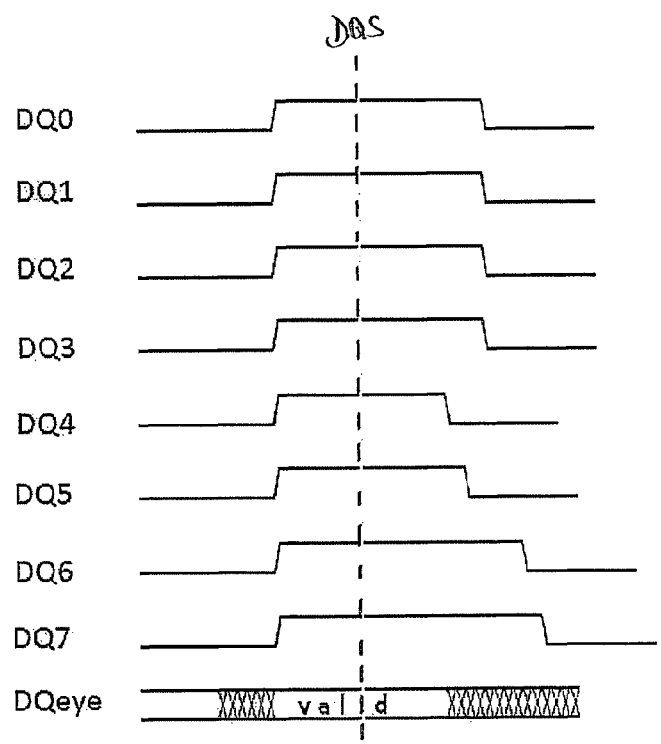
FIG. 4C schematically illustrates example relative timing of eight DQ bits and the resulting DQ read eye when the starting points of each DQ bit are aligned with one another.

FIG. 4C shows, for comparison, the result after a per-bit de-skew calibration which has been performed according to a procedure in which all DQ bits have been adjusted to have a common starting point to their read eye.

Figure 4D:
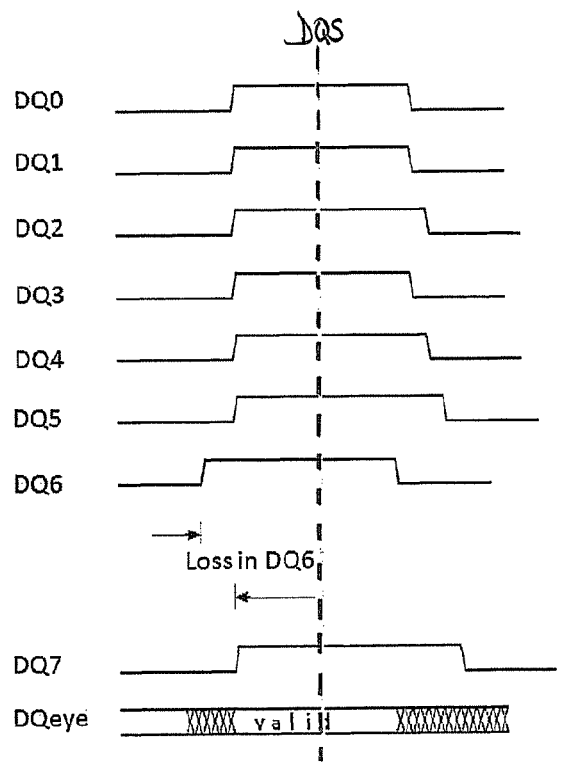
FIG. 4D schematically illustrates example relative timing of eight DQ bits and the resulting DQ read eye in a scenario in which one DQ bit has too great a skew to allow correction according to one embodiment.

FIG. 4D illustrates a result after a per-bit de-skew calibration which has been performed using the "minimum eye" mode, according to which all DQ bits have been adjusted to have a common starting point to their read eye, in this case when the required correction for one DQ bit (DQ6) is too great to be able to be corrected by the respective de-skew DLL for that bit, and accordingly some per-bit loss occurs. This causes some loss in the opening of the data eye and is reported to the user.

Figure 5A:
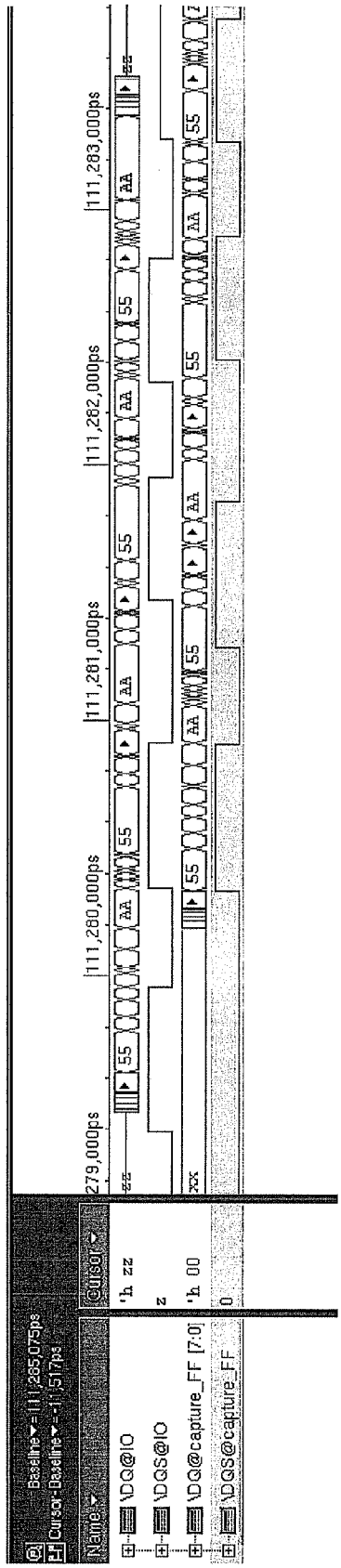
FIG. 5A shows a simulation of the timing relationship between DQ and DQS prior to calibration.
Figure 5B:
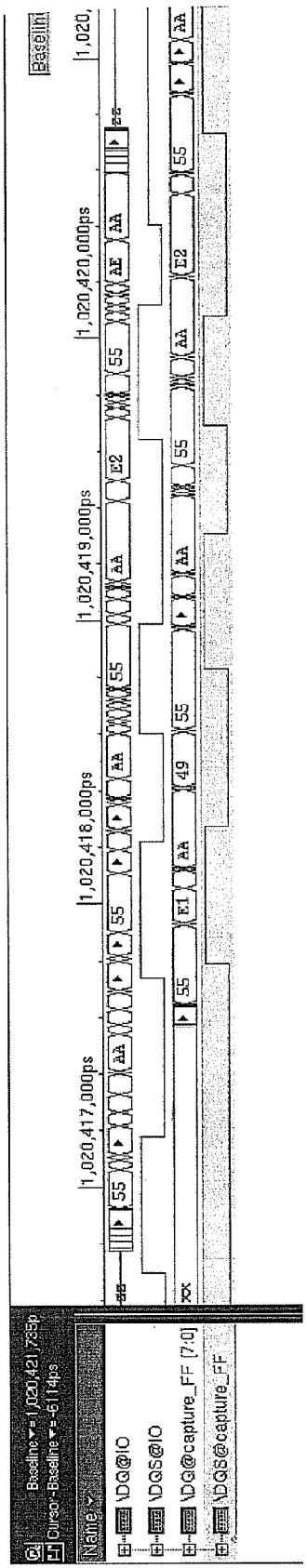
FIG. 5B shows a simulation of the timing relationship between DQ and DQS after calibration.

FIGS. 5A and 5B show two simulation results. FIG. 5A shows the relationship between DQ and DQS before the per-bit read calibration described above. The valid data pattern is 0xAA55. In this configuration the data signal receiver cannot reliably capture data as the data valid window (the read eye) does not allow DQS to be reliably centred in the data burst). FIG. 5B shows the same simulated situation after the per-bit read calibration has been carried out. The valid data pattern is again 0xAA55. The read eye opening is now increased at the capture flops (capture_FF) and DQS is now placed in the centre of the eye. The system can now more reliably capture the data burst.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of calibrating a data signal receiver, said data signal receiver configured to receive a multi-bit data signal and an associated data strobe signal, wherein transitions of said data strobe signal indicate sample points for said multi-bit data signal, the method comprising the steps of:
   receiving, on each bit of said multi-bit data signal, a sample of a predetermined data pattern;
   determining, for each bit of said multi-bit data signal, a relative start timing value indicative of a start of said predetermined data pattern;
   determining, for each bit of said multi-bit data signal, a relative end timing value indicative of an end of said predetermined data pattern;
   determining, for each bit of said multi-bit data signal, a mid-point timing value halfway between said relative start timing value and said relative end timing value;
   applying a bit timing delay to each bit of said multi-bit data signal such that the mid-point timing values are aligned; and
   applying a strobe timing delay to said associated data strobe signal to align said associated data strobe signal with the aligned mid-point timing values.

2. The method as claimed in claim 1, wherein determining said relative start timing value comprises:
   comparing said sample of said predetermined data pattern received in said receiving step with a predetermined data pattern portion when said associated data strobe signal has a timing offset;
   if said sample of said predetermined data pattern received in said receiving step does not match said predetermined data pattern portion, incrementing said timing offset and repeating said receiving step; and
   determining said relative start timing value with reference to said timing offset when said sample of said predetermined data pattern received in said receiving step matches said predetermined data pattern portion.

3. The method as claimed in claim 2, wherein said incrementing said timing offset and repeating said receiving step comprises:
   a first stage in which said timing offset is incremented at each iteration by a coarse increment until said predetermined data pattern received in said receiving step matches said predetermined data pattern portion; and
   a second stage in which said timing offset is incremented at each iteration by a fine increment until said predetermined data pattern received in said receiving step matches said predetermined data pattern portion,
   wherein said timing offset is stepped back between said first stage and said second stage, such that said second stage at least partially repeats a timing offset range covered by a last iteration of said first stage.

4. The method as claimed in claim 3, wherein said coarse increment is 1/16 of a clock cycle, said fine increment is 1/256 of a clock cycle, said timing offset is stepped back 3/16 of a clock cycle between said first stage and said second stage.

5. The method as claimed in claim 1, wherein determining said relative end timing value comprises:
   comparing said sample of said predetermined data pattern received in said receiving step with a predetermined data pattern portion when said associated data strobe signal has a timing offset;
   if said sample of said predetermined data pattern received in said receiving step matches said predetermined data pattern portion, incrementing said timing offset and repeating said receiving step; and
   determining said relative end timing value with reference to said timing offset when said sample of said predetermined data pattern received in said receiving step no longer matches said predetermined data pattern portion.

6. The method as claimed in claim 1, wherein said bit timing delay applied to each bit of said multi-bit data signal is initially set to a minimum value prior to carrying out the method, said minimum value selected such that said sample of said predetermined data pattern received in said receiving step does not match said predetermined data pattern portion.

7. The method as claimed in claim 1, wherein said bit timing delay is configurable to take a range of values corresponding to a quarter clock cycle.

8. The method as claimed in claim 1, wherein said strobe timing delay applied to said associated data strobe signal is initially set to a minimum value prior to carrying out the method.

9. The method as claimed in claim 1, if said bit timing delay for any bit of said multi-bit data signal is determined to exceed a predetermined maximum value, the method further comprises substituting said bit timing delay for each bit with a replacement bit timing delay and substituting said strobe timing delay with a replacement strobe timing delay,
   wherein said replacement bit timing delay for each bit is determined such that said starts of said predetermined data pattern for said multi-bit data signal are aligned; and
   said replacement strobe timing delay is determined to align said associated data strobe signal with a mid-way point between said aligned starts of said predetermined data pattern and an earliest relative end timing value amongst the bits of said multi-bit data signal.

10. The method as claimed in claim 9, further comprising outputting per-bit loss information derived from said replacement bit timing delay for each bit.

11. The method as claimed in claim 10, wherein said per-bit loss information is determined as said replacement bit timing delay for each bit minus a quarter cycle where said replacement bit timing delay is greater than a quarter cycle, and is determined as zero where said replacement bit timing delay is less than or equal to a quarter cycle.

12. The method as claimed in claim 1, wherein said steps of receiving said sample of a predetermined data pattern, determining said relative start timing value and determining said relative end timing value are repeated to determine average values for said relative start timing value and said relative end timing value.

13. The method as claimed in claim 1, wherein said receiving step comprises capturing a predetermined number of data bits and said sample is selected as less than all of said predetermined number of data bits.

14. The method as claimed in claim 13, wherein said predetermined number of data bits is eight and said sample is selected as four data bits.

15. The method as claimed in claim 14, wherein said four data bits are a middle four data bits of said predetermined number of data bits.

16. The method as claimed in claim 1, further comprising requiring a minimum predetermined pattern length between said relative start timing value and said relative end timing value.

17. The method as claimed in claim 1, wherein said data signal receiver is a DDR DRAM controller.

18. A computer program product storing in a non-transient fashion a computer program configured to cause the execution of the method as claimed in claim 1.

19. A data signal receiver, said data signal receiver configured to receive a multi-bit data signal and an associated data strobe signal, wherein transitions of said data strobe signal indicate sample points for said multi-bit data signal, the data signal receiver configured to perform a calibration process and comprising:
- a receiver configured to receive, on each bit of said multi-bit data signal, a sample of a predetermined data pattern;
- a timing calculator configured to determine, for each bit of said multi-bit data signal, a relative start timing value indicative of a start of said predetermined data pattern,
- said timing calculator configured to determine, for each bit of said multi-bit data signal, a relative end timing value indicative of an end of said predetermined data pattern, and
- said timing calculator configured to determine, for each bit of said multi-bit data signal, a mid-point timing value halfway between said relative start timing value and said relative end timing value;
- bit timing delay circuitry configured to apply a bit timing delay to each bit of said multi-bit data signal such that the mid-point timing values are aligned; and
- strobe timing delay circuitry configured apply a strobe timing delay to said associated data strobe signal to align said associated data strobe signal with the aligned mid-point timing values.

20. A data signal receiver, said data signal receiver configured to receive a multi-bit data signal and an associated data strobe signal, wherein transitions of said data strobe signal indicate sample points for said multi-bit data signal, the data signal receiver configured to perform a calibration process and comprising:
- means for receiving, on each bit of said multi-bit data signal, a sample of a predetermined data pattern;
- means for determining, for each bit of said multi-bit data signal, a relative start timing value indicative of a start of said predetermined data pattern;
- means for determining, for each bit of said multi-bit data signal, a relative end timing value indicative of an end of said predetermined data pattern;
- means for determining, for each bit of said multi-bit data signal, a mid-point timing value halfway between said relative start timing value and said relative end timing value;
- means for applying a bit timing delay to each bit of said multi-bit data signal such that the mid-point timing values are aligned; and
- means for applying a strobe timing delay to said associated data strobe signal to align said associated data strobe signal with the aligned mid-point timing values.

\* \* \* \* \*